(12) United States Patent
Pang et al.

(10) Patent No.: US 11,289,792 B2
(45) Date of Patent: Mar. 29, 2022

(54) COMMUNICATION DEVICE COMPRISING A MOUNTING STRUCTURE AND VALVE UNIT

(71) Applicant: Hitachi Energy Switzerland AG, Baden (CH)

(72) Inventors: Zhibo Pang, Västerås (SE); Nan Chen, Västerås (SE); Mikael Davidsson, Västerås (SE); Michele Luvisotto, Västerås (SE)

(73) Assignee: HITACHI ENERGY SWITZERLAND AG, Baden (CH)

( * ) Notice: Subject to any disclaimer, the term of this patent is extended or adjusted under 35 U.S.C. 154(b) by 13 days.

(21) Appl. No.: 16/816,987

(22) Filed: Mar. 12, 2020

(65) Prior Publication Data

US 2020/0295434 A1 Sep. 17, 2020

(30) Foreign Application Priority Data

Mar. 12, 2019 (EP) .................................... 19162288

(51) Int. Cl.
| | |
|---|---|
| H01Q 1/22 | (2006.01) |
| F16K 31/02 | (2006.01) |
| H02M 1/08 | (2006.01) |
| H05K 5/02 | (2006.01) |
| H05K 9/00 | (2006.01) |

(52) U.S. Cl.
CPC .............. *H01Q 1/22* (2013.01); *F16K 31/02* (2013.01); *H02M 1/08* (2013.01); *H05K 5/0217* (2013.01); *H05K 9/0081* (2013.01)

(58) Field of Classification Search
CPC .. H02J 3/36; H02J 13/00017; H02J 13/00022; H02J 13/00028; H02J 13/0003; H02J 13/0004
See application file for complete search history.

(56) References Cited

U.S. PATENT DOCUMENTS

| | | | |
|---|---|---|---|
| 2016/0172860 A1* | 6/2016 | Lipan | H02J 3/383 |
| | | | 307/52 |
| 2018/0262120 A1 | 9/2018 | Zhang et al. | |

(Continued)

FOREIGN PATENT DOCUMENTS

| | | |
|---|---|---|
| CN | 104901515 A | 9/2015 |
| CN | 105938045 A | 9/2016 |

(Continued)

*Primary Examiner* — Monica C King
(74) *Attorney, Agent, or Firm* — Slater Matsil, LLP

(57) ABSTRACT

A communication device can be used for communicating between a power equipment controller and power equipment devices of a high-voltage power electronics system. The communication device includes a controller interface communicatively coupled with the power equipment controller, an RF module coupled to the controller interface, and an antenna port coupled to the RF module. A mounting structure is configured to attach the communication device to a valve hall containing the power equipment devices. The mounting structure is permeable for RF signal communication between the communication device and power equipment devices in the valve hall. The mounting structure has a low voltage side to enable placement of the controller interface, the RF module and the antenna port so as to be shielded from disturbances due to high voltages inside the valve hall.

20 Claims, 4 Drawing Sheets

(56) References Cited

U.S. PATENT DOCUMENTS

2018/0262272 A1* 9/2018 Ashrafi ................ H04L 9/0858
2020/0091964 A1* 3/2020 Zhibo .................... H04B 3/548

FOREIGN PATENT DOCUMENTS

| CN | 107172842 A | 9/2017 |
| CN | 207366521 U | 5/2018 |
| WO | 2018113960 A1 | 6/2018 |

* cited by examiner

COMMUNICATION DEVICE COMPRISING A MOUNTING STRUCTURE AND VALVE UNIT

CROSS-REFERENCE TO RELATED APPLICATIONS

This application claims priority to European Patent Application No. 19162288.5, filed on Mar. 12, 2019, which application is hereby incorporated herein by reference.

TECHNICAL FIELD

Embodiments of the present disclosure relates to a communication device comprising a mounting structure and valve unit.

BACKGROUND

In traditional high-voltage power electronics systems such as switchgear, HVDC (High Voltage Direct Current), and/or FACTS (Flexible Alternating Current Transmission Systems), etc., the switching of power electronics modules is controlled through wired links, for example optical fibers. Due to the complexity of such systems and the high number of power electronics modules involved, several thousands of cables are often deployed, with a strong impact in structural design, installation and commissioning costs. Moreover, optical fibers being subject to high difference potentials, as it is the case in high-voltage systems, increases risk of flammability. Also, optical transmitters have a much shorter life cycle than power electronics components, with failure rates that can be up to 20 times higher.

One way to reduce these problems would be to migrate from wired to wireless communication of control signals. However, the environment of a high-voltage power electronics system is very difficult for wireless communication. There are enclosures creating reflections and affecting attenuation. The presence of metal objects causes further signal propagation issues and the switching and high voltage electronic components can cause interference. Field tests have confirmed that the radio propagation environment inside valve halls is much worse than outside.

Additionally, any maintenance to communication equipment needs to be able to occur in a safe and reliable manner.

SUMMARY

Embodiments relate to the field of radio frequency (RF) communication and particular embodiments to a communication device comprising a mounting structure and a valve unit.

Embodiments provide wireless communication where maintenance and repairs can be performed in a manner which is safe and reliable.

According to a first aspect, a communication device is provided for communicating between a power equipment controller and power equipment devices of a high-voltage power electronics system. The communication device comprises a controller interface for communicating with the power equipment controller, at least one RF (radio frequency) module comprising circuitry for processing RF signals; an antenna port, and a mounting structure configured to attach the communication device to a valve hall containing the power equipment devices. The mounting structure is permeable for RF signal communication between the communication device and power equipment devices in the valve hall, while the mounting structure enables placement of the mentioned components, on a low voltage side, to shield from disturbances due to high voltages inside the valve hall.

The communication device may further comprise an antenna provided on the low voltage side of the mounting structure, wherein the mounting structure allows RF signals to pass through between the low voltage side and the valve hall.

The mounting structure may comprise a front piece and a back piece, wherein the front piece is permeable for wireless RF signals and the back piece is made of metal.

The back piece may comprise flanges configured to, when installed, overlap valve hall walls.

The communication device may further comprise an antenna provided on a valve hall side of the mounting structure.

The front piece may be permeable for the RF signals, while blocking signals of other frequency bands.

The communication device may be configured to pass RF signals from the low voltage side of the mounting structure to the interior of the valve hall in a cable.

The mounting structure may be made of metal.

According to a second aspect, a communication assembly comprises two communication devices according to the first aspect.

According to a third aspect, a valve unit comprises a plurality of power electronic modules, a housing, an opening horizontally centered in the housing, a power equipment communication module, and an antenna, connected to the power equipment communication module. The antenna is provided essentially horizontally centered in the valve unit.

The opening may be provided in the top of the housing.

The antenna may be provided in the opening.

The plurality of power electronic modules may be distributed horizontally on the same vertical level.

Each one of the plurality of power electronic modules may comprise a gate controller and a high power switching device.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

Aspects and embodiments are now described, by way of example, with reference to the accompanying drawings, in which.

DETAILED DESCRIPTION OF ILLUSTRATIVE EMBODIMENTS

The aspects of the present disclosure will now be described more fully hereinafter with reference to the accompanying drawings, in which certain embodiments of the invention are shown. These aspects may, however, be embodied in many different forms and should not be construed as limiting; rather, these embodiments are provided by way of example so that this disclosure will be thorough and complete, and to fully convey the scope of all aspects of invention to those skilled in the art. Like numbers refer to like elements throughout the description.

Figure 1:
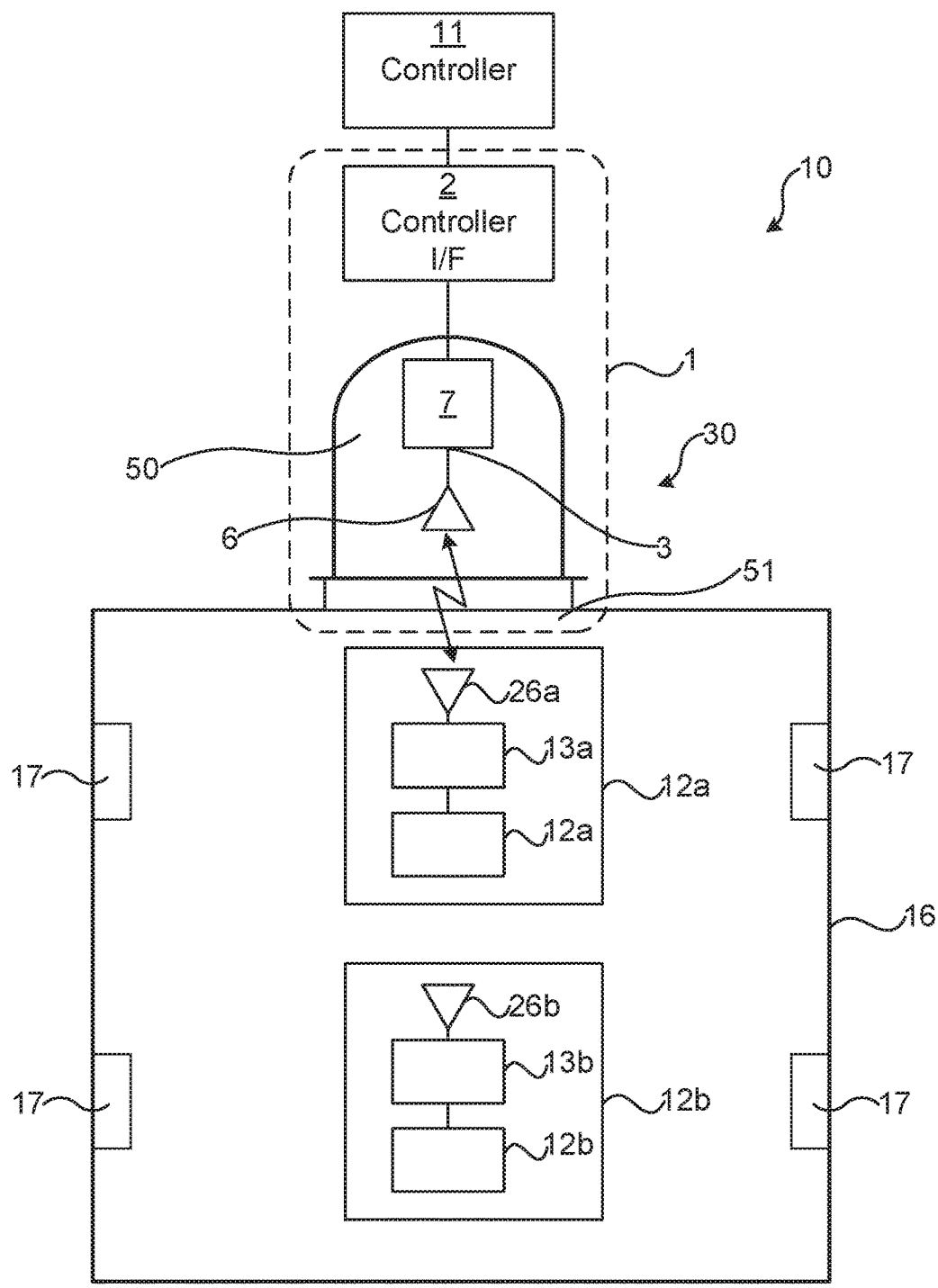
FIG. 1 is a schematic drawing illustrating an environment in which embodiments presented herein can be applied.

FIG. 1 is a schematic drawing illustrating an environment being a high-voltage power electronics system 10 in which embodiments presented herein can be applied. The high-voltage power electronics system can, e.g., be in the form of switchgear, HVDC, and/or FACTS, etc.

A power equipment controller 11 needs to communicate with one or more power equipment devices 12a-b. The power equipment devices 12a-b can, e.g., be valve units, local controllers, measurement equipment, etc. or any combination or multiple instances of these. Each one of the power equipment devices 12a-b communicates using a respective power equipment communication module 13a-b and a corresponding antenna 26a-b. The power equipment devices 12a-b are provided inside a valve hall 16. The valve hall 16 can comprise walls, roof and floor and can thus be provided in the form of a building.

A communication device 1 is provided for communicating between the power equipment controller 11 and the power equipment devices 12a-b.

The communication device 1 is connected to a controller interface 2 for communicating with the power equipment controller 11. The controller interface 2 can e.g. be based on an optical interface, a conductive interface or a wireless interface. The controller interface can, e.g., based on any suitable Ethernet or IEEE 802.11.x standard, upon which, e.g., Internet Protocol (IP) can be used. Alternatively or additionally, custom protocols can be used for low overhead, high performance, communication.

An RF (radio frequency) module 7 is provided, comprising circuitry for processing RF transmission signals (based on signals provided from the power equipment controller 11) and received RF signals (resulting in signals being provided to the power equipment controller 11). An antenna 6 is configured to transmit the RF transmission signal to at least one power equipment device 12a-b and to receive RF signals therefrom using radio signals.

The communication device 1 comprises a mounting structure 30 which is configured to attach the communication device 1 to the valve hall 16 containing the power equipment devices 12a-b. The mounting structure 30 is permeable for RF signal communication between the communication device 1 and power equipment devices 12a-b) in the valve hall. At the same time, the mounting structure 30 shields the mentioned components of the communication device 1, on a low voltage side 50, from disturbances due to high voltages inside the valve hall 16 on a high voltage side 51. The shielding is achieved by blocking disturbances due to a strong electric field and/or electromagnetic field. The shielding makes it safe for people to on the low voltage side 50, e.g., for maintenance or replacing components. Furthermore, the shielding reduces leakage of EMI (Electromagnetic Interference) from power electronics of the valve hall to the external environment. The connection between the communication device 1 and the controller interface 2 passes through a hole in the back (i.e., away from the valve hall 16) of the mounting structure 30. Alternatively, the controller interface 2 can be provided inside the mounting structure 30.

By providing the mounting structure 30, the components on the inside of the mounting structure 30 are separated from the high voltage environment 51 of the valve hall. This allows safe maintenance or repairs of the communication device 1.

One aspect to consider when providing wireless communication in a valve hall is the emissions radiated from the wireless signals to the external environment. Significant design effort is taken when designing the valve hall to avoid any EMI due to the switching of power electronics, so the wireless links should comply with this policy. This issue is particularly relevant since RF signals in the GHz frequency range have a short wavelength and hence can easily escape outside the valve hall.

One way to address this issue is to add RF absorbers in the valve hall 16. RF absorbers 17 can then be placed on the sides and the ceiling of the valve hall 16, in order to absorb specific frequencies of the wireless communication. This avoids significant RF emissions outside the valve hall. RF absorbers are inexpensive and do not add significant cost to the installation.

Figure 2:
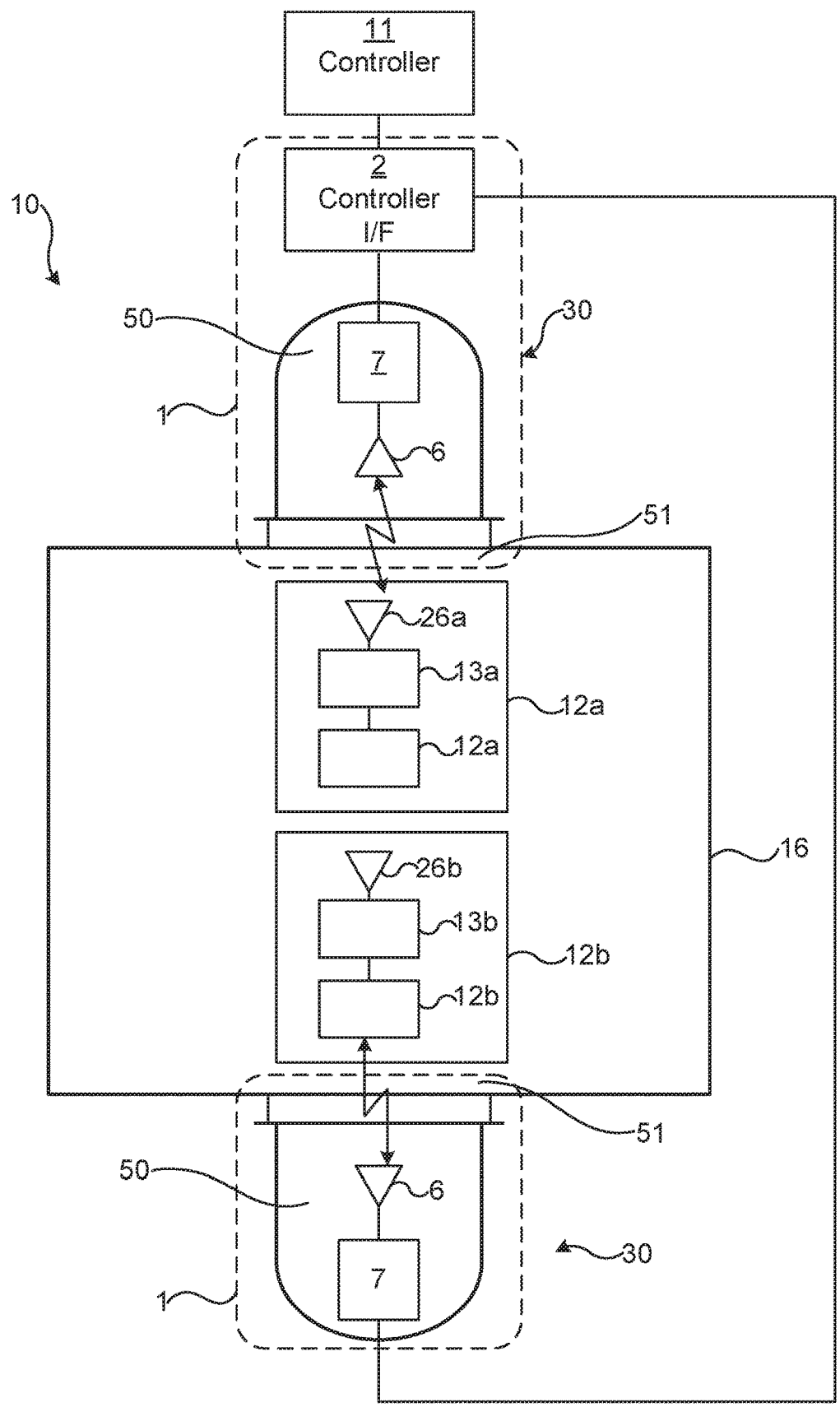
FIG. 2 is a schematic drawing illustrating an embodiment similar to that of FIG. 1, but comprising two communication devices with respective mounting structures.

FIG. 2 is a schematic drawing illustrating an embodiment similar to that of FIG. 1, but comprising two communication devices 1 with respective mounting structures 30.

Both communication devices 1 are connected to the controller interface 2. By providing two communication devices 1, redundancy in communication is achieved, thus improving reliability of communication between the power equipment controller 11 and the power equipment devices 12a-b. Moreover, one communication device can be repaired or maintained while the other one is active, thus providing maintenance and repairs to communication device with no downtime in functionality of the high-voltage power electronics system 10.

When there are two or more communication devices 1, each one of the communication devices 1 can receive the same data (from the power equipment controller 11) to transmit. In such a case, the RF transmission signals can optionally differ between different RF modules 7, e.g. by using different communication channels for their RF transmission signals. The different communication channels can differ in at least one of frequency, time slots, and encoding.

The two or more communication devices 1 can collectively be considered a communication assembly.

Figure 3:
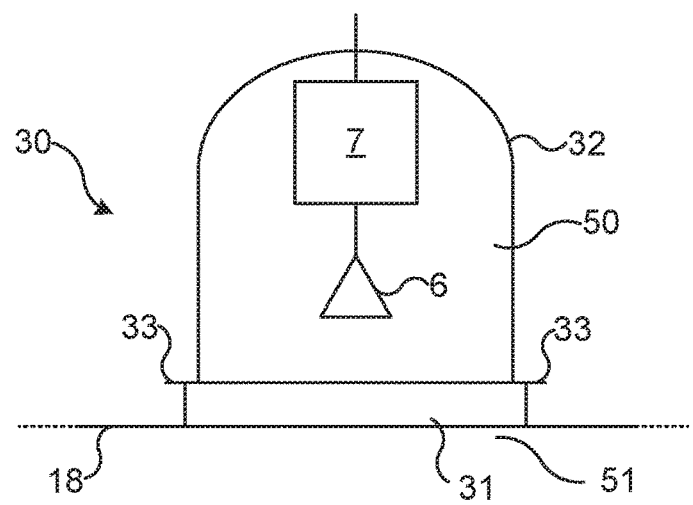
FIG. 3 is a schematic drawing illustrating a mounting structure according to an embodiment where wireless RF signals can pass through the mounting structure.

FIG. 3 is a schematic drawing illustrating a mounting structure 30 according to an embodiment where wireless RF signals can pass through the mounting structure 30. Here, the antenna 6 is provided on the low voltage side 50 of the mounting structure 30, i.e. separated from the valve hall. The mounting structure 30 allows RF signals to pass through between the low voltage side 50 to the valve hall, to thereby pass wireless RF signals between the antenna 6 and the antennas 26a-b of the power equipment devices 12a-b.

The mounting structure 30 comprises a front piece 31, which in the embodiment in FIG. 3 is in the form of a sealing plate, and optionally a back piece 32, which in the embodiment in FIG. 3 is in the form of a dome shaped cover, wherein the front piece 31 is permeable for wireless RF signals. In other words, the path loss for RF signals through the front piece 31 is within an acceptable range to enable signals between the antenna 6 and power equipment devices inside the valve hall. The back piece 32 may be made of metal. Optionally, the back piece 32 comprises flanges 33 configured to, when installed, overlap valve hall walls 18. The flanges 33 allow the mounting structure 30 to be safely secured to the valve hall walls, e.g. by bolting the flanges 33 to the valve hall walls. The back piece 32, as well as the RF module 7, can be removed without removing the front piece 31, which would expose the valve hall 16. For example, the front piece 31 and the back piece 32 can be fastened to the valve hall walls 18 using separate screws and bolts.

In one embodiment, a frequency selective material is used for the front piece 31, such that the front piece is permeable to for signals in the frequency range used for wireless communication (e.g., 1-10 GHz). At the same time, signals of other frequencies, such as EMI emitted from power electronics in other frequency bands are blocked. In this way, the level of emissions outside the valve hall would not significantly increase due to the installation of wireless communication, while still allowing good communication performance for the RF signals between the controller 11 and the power equipment devices.

Figure 4:
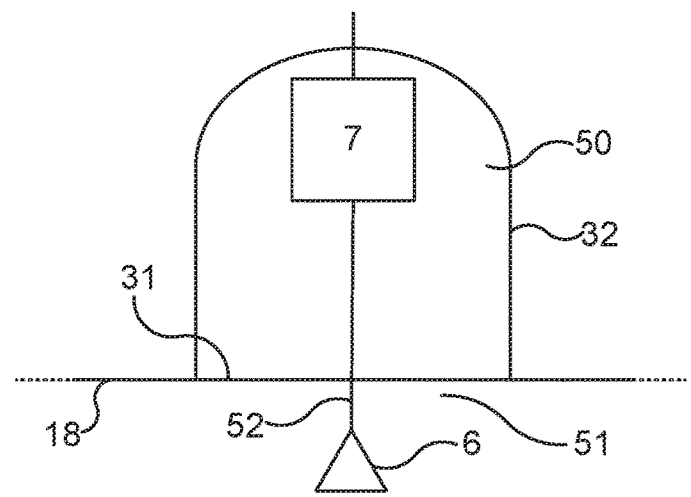
FIG. 4 is a schematic drawing illustrating a mounting structure according to an embodiment where RF signals are passed through the mounting structure in a cable.

FIG. 4 is a schematic drawing illustrating a mounting structure 30 according to an embodiment where RF signals are passed from the low voltage side 50 of the mounting structure to the interior of the valve hall 16 in a cable 52. In this embodiment, the cable 52 is passed through an opening in the front piece 31 of the mounting structure 30 between the low voltage side (interior) 50 and the high voltage side (exterior) 51. The antenna 6 is here provided on the valve hall side of the mounting structure 30 and can be connected, e.g., using a BNC (Bayonet Neill-Concelman) connector. Optionally, the back piece 32 is provided with flanges. In the embodiment illustrated in FIG. 4 the front piece 31 may be embodied as a metallic plate or may be part of the wall of the valve hall.

It is to be noted that the back piece 32 (of either one or both of the embodiments of FIGS. 3 and 4) can be made of metal or another material.

Figure 5:
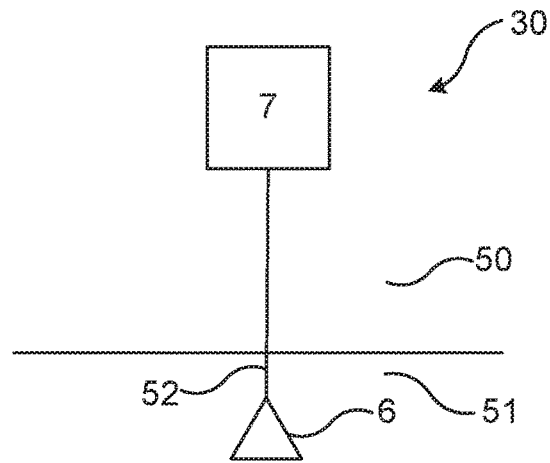
FIG. 5 is a schematic drawing illustrating a mounting structure according to an embodiment similar to the embodiment of FIG. 4, but without a back piece.

FIG. 5 is a schematic drawing illustrating a mounting structure according to an embodiment similar to the embodiment of FIG. 4, but without a back piece. Also here, the RF signals are passed through into the valve hall 16 in a cable 52. The mounting structure here mainly contains a feedthrough connector for the cable 52 to the antenna 6. In this way, both the back piece and the front piece are not needed. The antenna 6 is fully contained within the valve hall. While the antenna 6 is not easily replaced, the antenna is a very robust passive element, so it rarely needs replacing. Again, the RF module 7 is on the low voltage side 50 and is thus shielded from disturbances on the high voltage side 51.

Using the embodiments described above, the wall of the valve hall does not need to be opened when an RF module needs to be replaced, or the communication device otherwise needs to be repaired. Such opening of the valve hall negatively affects air quality inside the valve hall, especially if an insulation gas (such as nitrogen) is used in the valve hall design. Also, by avoiding opening the valve hall, it is easier to ensure that EMI requirements are satisfied according to industrial standards.

Figure 6:
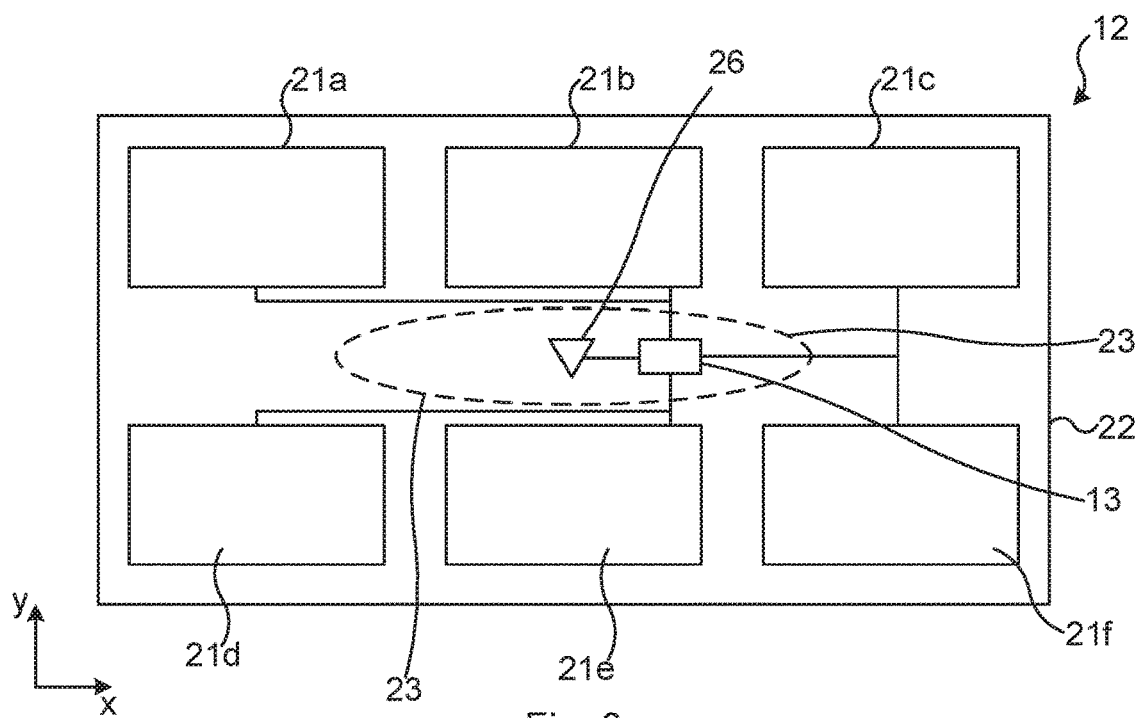
FIG. 6 is a schematic top view drawing illustrating placement of an antenna in a valve unit.

FIG. 6 is a schematic top view drawing illustrating placement of an antenna in a valve unit 12. The valve unit 12 can be one of the power equipment devices 12a-b of FIGS. 1-2.

The valve unit 12 comprises: a plurality of power electronic modules 21a-f. Each one of the plurality of power electronic modules 21a-f comprises a gate controller and a high power switching device, such as an insulated-gate bipolar transistor (IGBT), and integrated gate-commutated thyristor (IGCT), or a bi-mode insulated gate transistor (BIGT). Each power electronic module 21a-f may further comprise one or more of driving circuits for the switching device, a bypass switch, supporting pole, busbar connector, power supply circuit, voltage sensor, current sensor, etc.

The valve unit 12 receives, via the power equipment communication module 13 (corresponding to power equipment communication modules 13a-b of FIGS. 1-2), control signals received from the power equipment controller (see ii of FIGS. 1-2) via the communication device 1. The control signals cause the valve unit to achieve a desired current and/or voltage e.g. to effect power conversion between AC (Alternating Current) and DC (Direct Current). The plurality of power electronic modules 21a-f can be distributed horizontally on the same vertical level. It is to be noted that while there are six power electronic modules provided in FIG. 6, there can be fewer or more power electronic modules to suit any particular installation. A single power equipment communication module 13 can be connected to all the power electronic modules 21a-f. Alternatively, the valve unit 12 is provided with several power equipment communication modules, each connected to one or more power electronic modules.

The design of the radio transmission interfaces in the valve unit is constrained by at least two factors. Firstly, the gaps between the metallic elements in the valve unit are very narrow. To maximize the quality of wireless signal, the antennas should be installed as close to the gaps as possible. Secondly, the antennas usually have sharp end points, which could cause very high density of electric field if not installed properly. This will be problematic for the insulation design. To solve these challenges, a proper design of the wireless interface is needed.

In the valve unit 12, a housing 22 is provided with an opening 23 horizontally centered in the housing. The opening 23 can be provided in the top (surface) of the housing 22. The housing 22 can be made of metal.

The antenna 26 (corresponding to antennas 26a-b of FIGS. 1-2), connected to the power equipment communication module 13, is here provided essentially horizontally centered in the valve unit 12, i.e. by the opening 23. In one embodiment, the antenna 26 is provided in the opening 23. Theoretical analysis, simulation and experimental tests all suggest that the density of electric field in the middle of the valve unit 12 between the power electronic modules 21a-f is much lower than the field in the gaps between valve units. Therefore, the impacts of the antennas on the electric field design is minimized. The opening 23 can be naturally formed as the gap between different power electronic modules or it can be preserved during the design of the valve unit on purpose, to allow proper radio signal propagation.

Figure 7:
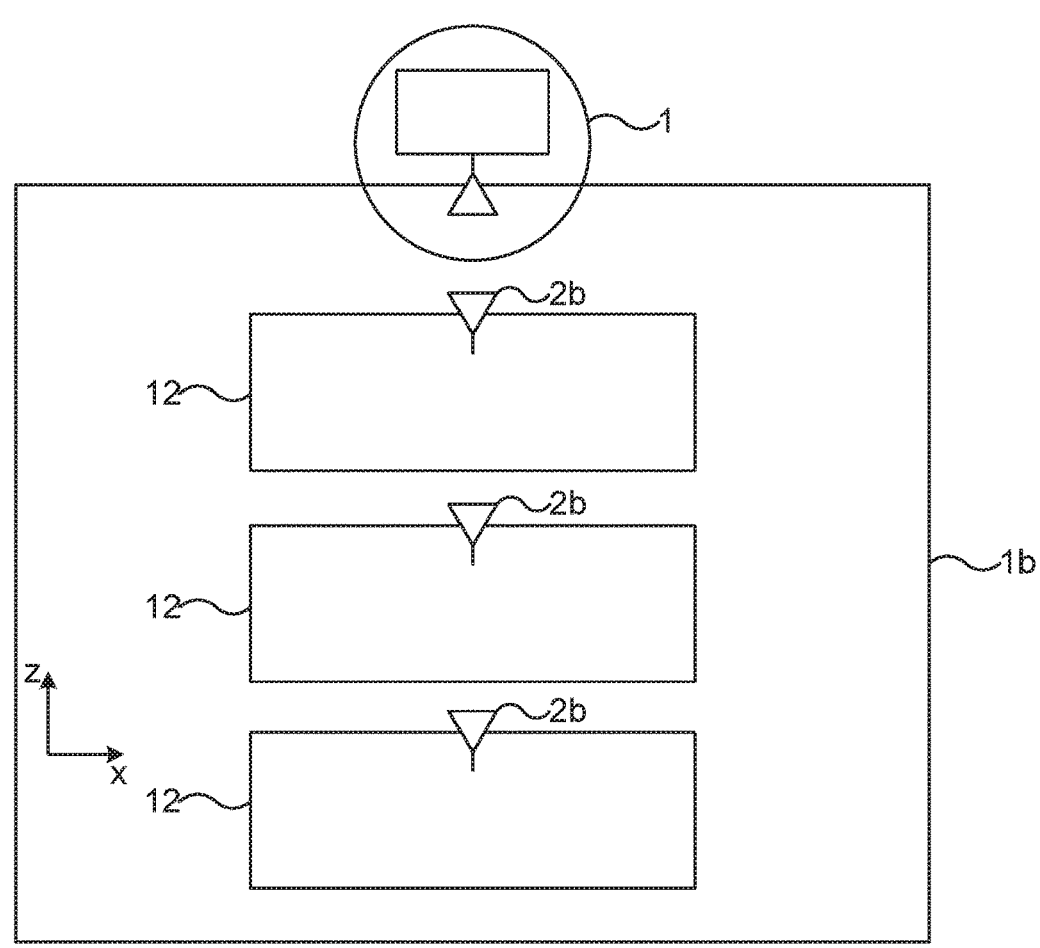
FIG. 7 is a schematic side view drawing illustrating an arrangement of a plurality of valve units.

FIG. 7 is a schematic side view drawing illustrating an arrangement of a plurality of stacked valve units 12. Within the valve hall 16, valve units 12 are here provided vertically arranged. This aligns the openings, and antennas, and thus antenna beams vertically for several valve units, thus enabling good radio signal propagation. The antenna of the communication module 1 can be provided at the top of the valve hall to provide a good radio signal path between the communication module 1 and the valve units 12. At the top of the valve hall, there is an opening for a cooling water pipe which can be exploited for placement of the communication module 1 and its antenna. It is to be noted that there may be several such vertical arrangements of valve units 12.

Aspects of the present disclosure have mainly been described above with reference to a few embodiments. However, as is readily appreciated by a person skilled in the art, other embodiments than the ones disclosed above are equally possible within the scope of the invention, as defined by the appended patent claims. Thus, while various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A communication device for communicating between a power equipment controller and power equipment devices of a high-voltage power electronics system, the communication device comprising:
   a controller interface communicatively coupled with the power equipment controller;
   an RF (radio frequency) module coupled to the controller interface;
   an antenna port coupled to the RF module; and
   a mounting structure configured to attach the communication device to a valve hall containing the power equipment devices, wherein the mounting structure is permeable for RF signal communication between the communication device and power equipment devices in the valve hall and wherein the mounting structure has a low voltage side to enable placement of the controller interface, the RF module and the antenna port so as to be shielded from disturbances due to high voltages inside the valve hall.

2. The communication device according to claim 1, further comprising an antenna provided on the low voltage side of the mounting structure, wherein the mounting structure is configured to allow RF signals to pass through between the low voltage side and the valve hall.

3. The communication device according to claim 2, wherein the mounting structure comprises a front piece and a back piece, the front piece being permeable for wireless RF signals and the back piece impermeable for wireless RF signals.

4. The communication device according to claim 3, wherein the back piece is made of metal.

5. The communication device according to claim 3, wherein the back piece comprises flanges configured to, when installed, overlap valve hall walls.

6. The communication device according to claim 3, wherein the front piece is permeable for the RF signals, while blocking signals of other frequency bands.

7. The communication device according to claim 1, further comprising an antenna provided on a valve hall side of the mounting structure.

8. The communication device according to claim 7, wherein the communication device is configured to pass RF signals from the low voltage side of the mounting structure to the interior of the valve hall via a cable.

9. The communication device according to claim 7, wherein the mounting structure is made of metal.

10. A valve unit comprising:
    a plurality of power electronic modules;
    a housing;
    an opening horizontally centered in the housing;
    a power equipment communication module; and
    an antenna connected to the power equipment communication module, the antenna being provided essentially horizontally centered in the valve unit.

11. The valve unit according to claim 10, wherein the opening is provided in a top surface of the housing.

12. The valve unit according to claim 10, wherein the antenna is provided in the opening.

13. The valve unit according to claim 10, wherein the plurality of power electronic modules are distributed horizontally on the same vertical level.

14. The valve unit according to claim 10, wherein each one of the plurality of power electronic modules comprises a gate controller and a high power switching device.

15. A high-voltage power electronics system comprising:
    a valve hall;
    a plurality of power equipment devices within the valve hall;
    a first antenna coupled to the power equipment devices;
    a mounting structure attached to the valve hall;
    a controller interface;
    an RF (radio frequency) module coupled to the controller interface;
    an antenna port coupled to the RF module; and
    a second antenna coupled to the antenna port;
    wherein the mounting structure is permeable for RF signal communication between the first antenna and the second antenna; and
    wherein the mounting structure has a low voltage side to shield the controller interface, the RF module and the antenna port from disturbances due to high voltages inside the valve hall.

16. The system according to claim 15, wherein the valve hall comprises a valve hall housing having an opening horizontally centered in the valve hall housing, the system further comprising a power equipment communication module within the valve hall housing, wherein the first antenna is connected to the power equipment devices via the power equipment communication module, the first antenna being provided essentially horizontally centered in the valve hall housing.

17. The system according to claim 15, further comprising a power equipment controller, the controller interface being communicatively coupled with the power equipment controller.

18. The system according to claim 15, wherein the second antenna is provided on the low voltage side of the mounting structure and wherein the mounting structure is configured to allow RF signals to pass through between the low voltage side and the valve hall.

19. The system according to claim 18, wherein the mounting structure comprises a front piece and a back piece, the front piece being permeable for wireless RF signals and the back piece being made of a metal material.

20. The system according to claim 19, wherein the back piece comprises flanges configured to, when installed, overlap valve hall walls.

* * * * *